(12) United States Patent
Wang et al.

(10) Patent No.: US 10,593,644 B2
(45) Date of Patent: Mar. 17, 2020

(54) APPARATUS FOR ASSEMBLING DEVICES

(71) Applicant: Industrial Technology Research Institute, Hsinchu (TW)

(72) Inventors: Chin-Hung Wang, Hsinchu (TW); Yu-Wei Huang, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 493 days.

(21) Appl. No.: 15/222,958

(22) Filed: Jul. 29, 2016

(65) Prior Publication Data

US 2018/0035550 A1 Feb. 1, 2018

(51) Int. Cl.
*B23P 19/00* (2006.01)
*H01L 23/00* (2006.01)
*H05K 3/34* (2006.01)

(52) U.S. Cl.
CPC ...... *H01L 24/75* (2013.01); *H01L 2224/7598* (2013.01); *H01L 2224/75745* (2013.01); *H05K 3/341* (2013.01); *H05K 2203/085* (2013.01); *Y10T 29/53174* (2015.01)

(58) Field of Classification Search
CPC ............ G02F 1/163; H01L 2924/1461; H01L 41/042; H01L 41/0926; F04B 43/0054; A61B 2017/0011; Y10S 310/80; Y10T 29/53174
USPC ...... 29/739, 25.35, 709, 729, 738, 756, 846, 29/847, 890.1
See application file for complete search history.

(56) References Cited

U.S. PATENT DOCUMENTS

| | | | |
|---|---|---|---|
| 6,809,462 B2 * | 10/2004 | Pelrine | A63H 3/365 310/319 |
| 7,251,882 B2 | 8/2007 | Ricks et al. | |
| 7,595,580 B2 * | 9/2009 | Heim | F04B 43/0054 310/324 |
| 8,518,204 B2 | 8/2013 | Hu et al. | |
| 8,609,454 B2 | 12/2013 | Dai et al. | |
| 8,664,699 B2 | 3/2014 | Nuzzo et al. | |
| 8,915,143 B2 | 12/2014 | Guth et al. | |
| 2010/0171393 A1 | 7/2010 | Pei et al. | |

(Continued)

FOREIGN PATENT DOCUMENTS

| | | |
|---|---|---|
| CN | 100495030 | 6/2009 |
| CN | 102037390 | 4/2011 |
| CN | 102856328 | 1/2013 |

(Continued)

OTHER PUBLICATIONS

"Notice of allowance of Taiwan Counterpart Application", dated Apr. 12, 2017, p. 1-p. 5.

(Continued)

*Primary Examiner* — Thiem D Phan
(74) *Attorney, Agent, or Firm* — JCIPRNET

(57) ABSTRACT

An apparatus for assembling devices, comprising a plurality of actuated devices disposed on a substrate, each of the actuated devices comprising a first electrode disposed on and electrically connect to the substrate, a connecting pad disposed on the substrate, an electro-active polymer layer comprising a first surface disposed on the connecting pad and a second surface, and a second electrode disposed on the second surface of the electro-active polymer layer and electrically connected to the substrate.

7 Claims, 7 Drawing Sheets

(56) References Cited

U.S. PATENT DOCUMENTS

2013/0136870 A1    5/2013  Walsh et al.
2015/0084139 A1    3/2015  Teh et al.

FOREIGN PATENT DOCUMENTS

| | | |
|---|---|---|
| CN | 103128731 | 6/2013 |
| CN | 103999248 | 8/2014 |
| CN | 104916773 | 9/2015 |
| DE | 202012009111 | 1/2013 |
| KR | 20160005221 | 1/2016 |
| TW | 200951495 | 12/2009 |
| TW | 201032368 | 9/2010 |
| TW | M417644 | 12/2011 |
| TW | I440059 | 6/2014 |
| TW | 201524887 | 7/2015 |

OTHER PUBLICATIONS

Yoseph Bar-Cohen et al., "Electroactive Polymers (EAP) Characterization Methods", Proceedings of SPIE's 7th Annual International Symposium on Smart Structures and Materials, Mar. 1-5, 2000, pp. 1-5.

"Office Action of China Counterpart Application," dated May 7, 2019, p. 1-p. 6.

* cited by examiner

APPARATUS FOR ASSEMBLING DEVICES

BACKGROUND

Technical Field

The disclosure relates to a device assembling system, and especially relates to a micro devices assembling system.

Related Art

As the miniaturization of the electronic devices, the manufacturing, packaging, and assembling processes become more and more complex. When adopting different manufacturing methods, it is also easily to encounter the incapability of each manufacturing process, which causes the conventional manufacturing process becomes more difficult.

In batch production of micro devices, both of the difference of end processes and the yield of the product is the main issue to be considered. If micro devices in batch production can be chosen and divided into different groups and respectively taking different manufacturing process, the cost of each micro devices are relatively lower than those taking conventional manufacturing processes. As a result, the assembling method and packaging method of micro devices become the important issue in recent days.

SUMMARY

A device assembling system, comprising a plurality of actuated devices are disposed on a substrate in a manner of array, wherein each of the actuated devices comprising a first electrode disposed on the substrate and electrically connected to the substrate; a connecting pad disposed on the substrate; an electroactive material layer comprising a first surface and a second surface, wherein an end of the first surface is directly connected to the first electrode, and another end of the first surface is directly connected to the connecting pad; and a second electrode disposed on the second surface of the electric-actuated material layer, and electrically connected to the substrate.

A device assembling system comprising a substrate, comprising a plurality of actuated devices disposed on the substrate in a manner of array, wherein each of the actuated devices comprising a first electrode disposed on the substrate and electrically connected to the substrate; a connecting pad disposed on the substrate; a electroactive material layer comprising a first surface and a second surface, wherein an end of the first surface is directly connected to the first electrode and another end of the first surface is directly connected to the connecting pad; and a second electrode disposed on the second surface of the electroactive material layer and electrically connected to the substrate; an airtight structure; and a dividing plate disposed on the substrate via the airtight structure, wherein the dividing plate comprising a plurality of though holes, and each of the through holes are located respectively to each of the electroactive material layers of the actuated devices; wherein the substrate, the airtight structure, and the dividing plate form a chamber, and the substrate further comprising a channel connected from inside of the chamber to outside of the chamber.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
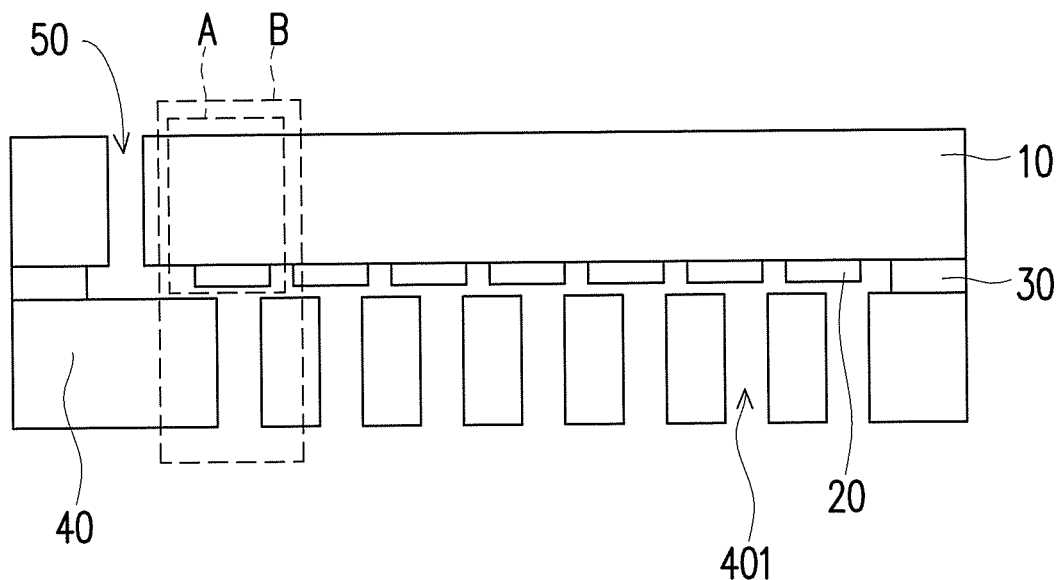
FIG. 1A is a cross sectional view of a device assembling system to an embodiment of the invention.
Figure 1B:
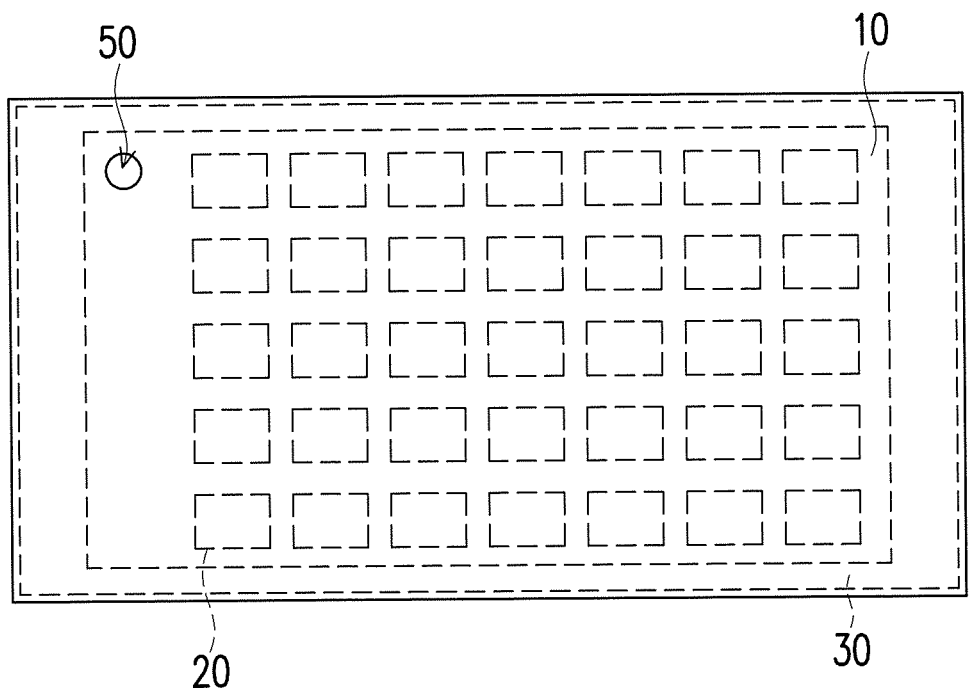
FIG. 1B is a top view of a device assembling system to an embodiment of the invention.

FIG. 1A is a cross sectional view of a device assembling system to an embodiment of the invention. FIG. 1B is a top view of a device assembling system to an embodiment of the invention. Referring to FIGS. 1A and 1B, the device assembling system including a substrate 10, a plurality actuated devices 20, an airtight structure 30, and a dividing plate 40. The actuated devices 20 are disposed on the substrate 10 and located between the substrate 10 and the dividing plate 40. The dividing plate 40 includes a plurality of through holes 401, and the dividing plate 40 connects to the substrate 10 through the airtight structure 30. Each of the through holes 401 is located respectively to the actuated devices 20. The airtight structure 30 is disposed between the substrate 10 and the dividing plate 40 and located at the peripheral of the substrate 10 and the dividing plate 40. The substrate 10, the airtight structure 30, and the dividing plate 40 form a chamber. The substrate 10 includes a channel 50 connecting to an external vacuum pump.

Figure 2:
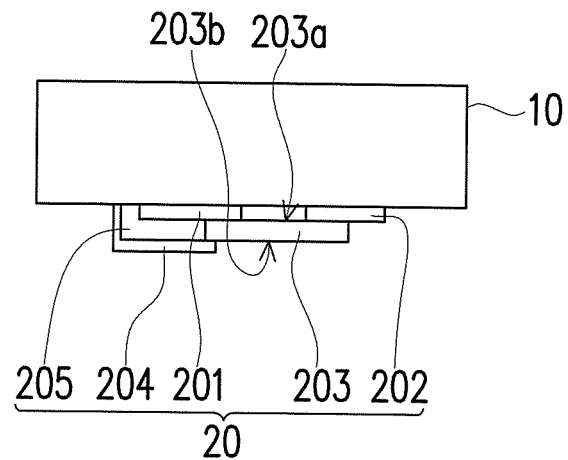
FIG. 2 is an enlarged view of portion A of a device assembling in FIG. 1A.

FIG. 2 is an enlarged view of portion A of a device assembling in FIG. 1A illustrating structure of a single actuated device 20. The actuated device 20 includes a first electrode 201, a connecting pad 202, a electroactive material layer 203, a second electrode 204, and an dielectric layer 205. The first electrode 201 and the connecting pad 202 are disposed on the substrate 10, and the first electrode 201 is electrically connected to the substrate 10. The electroactive material layer 203 includes a first surface 203a and a second surface 203b, an end of the first surface 203a is directly connected to the first electrode 201 and another end of the first surface 203a is directly disposed on the connecting pad 202. The second electrode 204 is disposed on the second surface 203b of the electroactive material layer 203, and the second electrode is electrically connected to the substrate 10.

In the embodiment, the first electrode 201 and the second electrode 204 are disposed along a same direction, and an dielectric layer 205 is disposed between the first electrode 201 and the second electrode 204. In others embodiments, the first electrode 201 and the second electrode 204 may be disposed along different directions to insulating the first electrode 201 and the second electrode 204, so the disclosure is not limited thereto.

Figure 3:
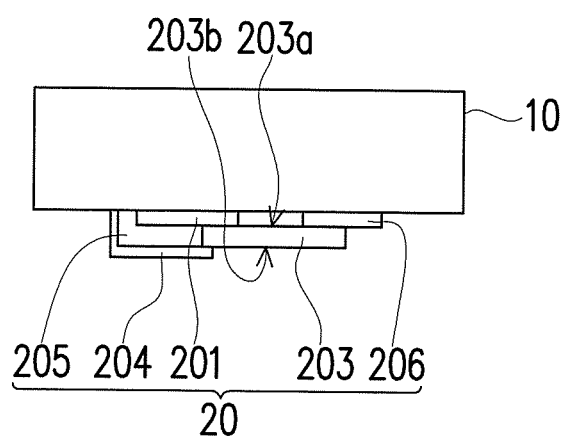
FIG. 3 is an enlarged view of portion A of a device assembling in FIG. 1A.

FIG. 3 is an enlarged view of portion A of a device assembling in FIG. 1A illustrating structure of a single actuated device 20 in another embodiment. The actuated device 20 includes a first electrode 201, a third electrode 206, a electroactive material layer 203, a second electrode 204, and an dielectric layer 205. The first electrode and the third electrode 206 are disposed on the substrate 10, and both the first electrode and the third electrode are electrically connected to the substrate 10. The electroactive material layer 203 includes a first surface 203a and a second surface 203b. An end of the first surface 203a is directly connected to the first electrode 201, and another end of the first surface 203a is directly connected to the third electrode 206. The second electrode 204 is disposed on the second surface 203b of the electroactive material layer 203, and the second surface 203b is electrically connected to the substrate 10. In the embodiment, the electric potential of the first electrode 201 and the electric potential of the third electrode 206 are the same. The electric potential of the first electrode 201 and the electric potential of the second electrode 204 are different. The electroactive material layer 203 is composed of at least one of Nafion, polyaniline, polypyrrole, polyacetylene, or other polymer material with a conjugated structure in its main chain, such as an oxidation or reduction capable carry electric charges with properly doping.

In the embodiment, the first electrode 201 and the second electrode 204 are disposed in the same direction, and a dielectric layer 205 is disposed between the first electrode 201 and the second electrode 204. In others embodiments, the first electrode 201 and the second electrode 204 may be disposed along different directions to insulating the first electrode 201 and the second electrode 204, so the disclosure is not limited thereto.

Figure 4:
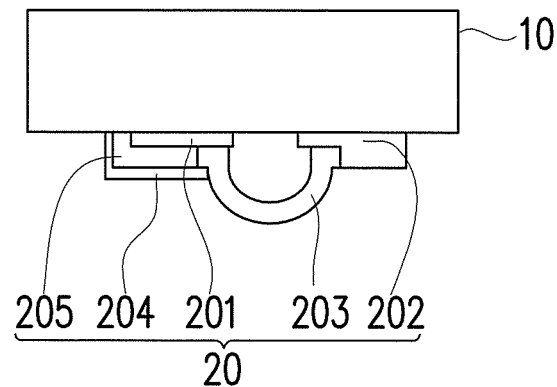
FIG. 4 is an enlarged view of portion A of a device assembling in FIG. 1A.

FIG. 4 is an enlarged view of portion A of a device assembling in FIG. 1A illustrating structure of a single actuated device 20 when applying voltage. The actuated device 20 includes a first electrode 201, a connecting pad 202, a electroactive material layer 203, a second electrode 204, and a dielectric layer 205. The first electrode and the connecting pad 202 are disposed on the substrate 10, and the first electrode 201 is electrically connected to the substrate 10. The electroactive material layer 203 includes a first surface 203a and a second surface 203b, an end of the first surface 203a is directly connected to the first electrode 201, and another end of the first surface 203a is directly connected to the connecting pad 202. The second electrode is disposed on the second surface 203b of the electroactive material layer 203, and the second electrode 204 is electrically connected to substrate 10.

When the first electrode 201 provides a first voltage to the first surface 203a of the electroactive material layer 203 and provides a second voltage to the second surface 203b of the electroactive material layer 203, the electroactive material layer 203 deforms to form a protrusion on the substrate 10 as a result of a voltage difference of the first voltage and the second voltage. In the embodiment, the electroactive material layer 203 is composed of Nafion, and the electroactive material layer 203 deforms to form a protrusion on the substrate 10 as a result of the first voltage is lower than the second voltage, but the disclosure is not limited thereto. In other embodiments, the electroactive material layer 203 may be composed of other polymer material with a conjugated structure in its main chain, such as an oxidation or reduction capable carry electric charges with properly doping, and the relationship of the first voltage and the second voltage may varies as a result of the material of the electroactive material layer 203.

Figure 5A:
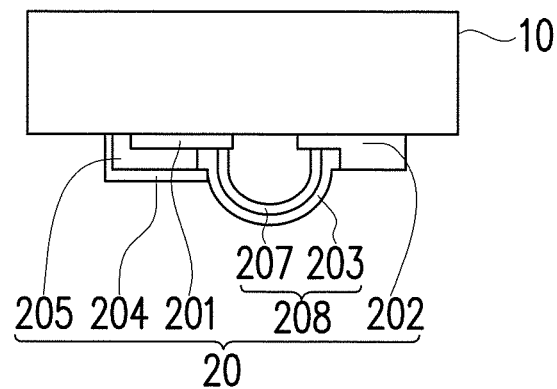
FIGS. 5A to 5B are an enlarged views of portion A of a device assembling in FIG. 1A.
Figure 5B:
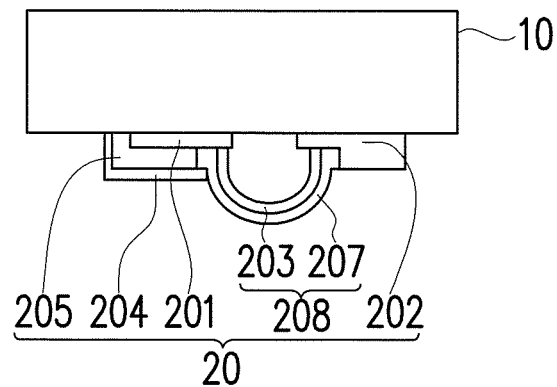

It is noted that although the electroactive material layer 203 is a single material layer, but the disclosure is not limited thereto. In other embodiments, a stacked material layer may be formed by stacking the electroactive material layer with a single or a plurality of material layers. For example, as shown in FIG. 5A, the electroactive material layer 203 is stacked with a base material layer 207 to form a stacked material layer 208. When the electroactive material layer 203 expands as a result of applied voltage, the stacked material layer 208 bends to the side of the electroactive material layer 203 because of the base material layer 207 is not effected by the applied voltage. For example, as shown in FIG. 5B, the electroactive material layer 203 is stacked with a base material layer 207 to form a stacked material layer 208. When the electroactive material layer 203 contracts as a result of applied voltage, the stacked material layer 208 bends to the side of the base material layer 207 because of the base material layer 207 is not effected by the applied voltage.

Figure 6:
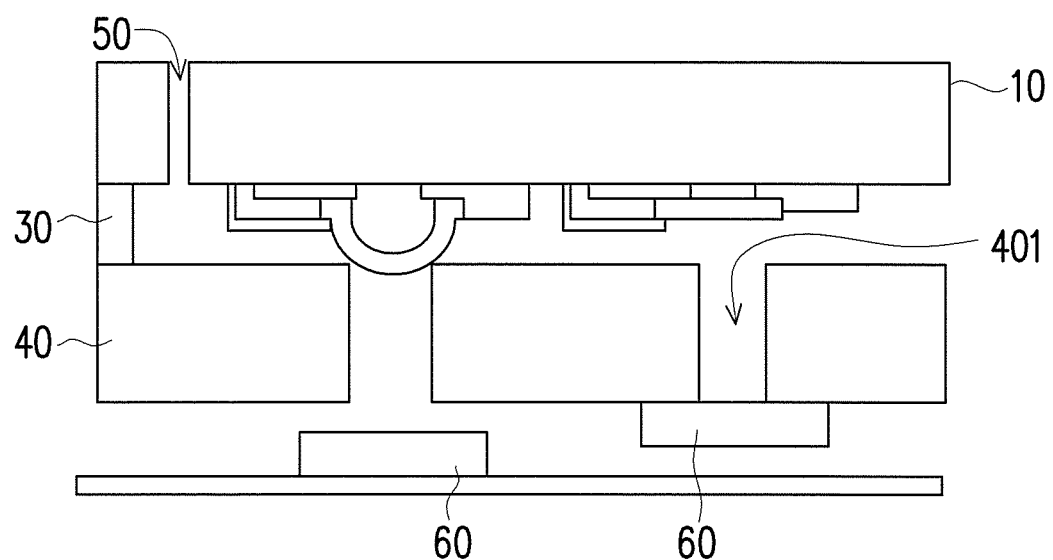
FIG. 6 is an enlarged view of portion B of a device assembling in FIG. 1A.

FIG. 6 is an enlarged view of portion B of a device assembling in FIG. 1A. The device assembling system includes a substrate 10, actuated devices 20, an airtight structure 30, and a dividing plate 40. The actuated devices 20 is disposed on the substrate 10 and located between the substrate 10 and the dividing plate 40. The dividing plate 40 includes a plurality of through holes 401, and the dividing plate 40 is connected to the substrate 10 through the airtight structure 30. The through holes 401 are respectively located on the dividing plate corresponding to the actuated devices 20. The substrate 10, the airtight structure 30, and the dividing plate 40 forms a chamber, and the substrate 10 includes a channel 50 connected to an external vacuum pump.

When the external vacuum pump is active, devices 60 are attracted on the dividing plate 40 over the through holes 401. In the embodiment, the substrate 10 further includes a plurality of switches respectively connected to the first electrodes 201 or the second electrodes 204 of each of the actuated devices 20, as to active selected actuated devices 20. The first electrodes 201 of each of the actuated devices 20 is, for example, connected in parallel and disposed on the substrate 10. The electroactive material layer 203 of the actuated devices 20 deform when the actuated devices 20 is active, and the through holes 401 corresponding to the active actuated devices are covered. The electroactive material layer 203 of the actuated devices 20 remain flat when the actuated devices 20 is not active, so the devices 60 may be attracted on the dividing plate 40 and over the through holes 401. As a result, the devices 60 may be selectively attracted on the dividing plate 40.

Figure 7A:
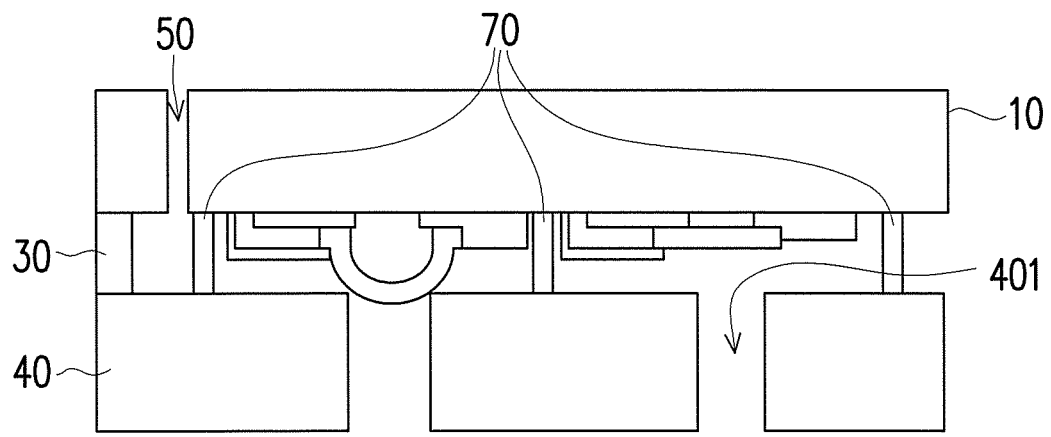
FIG. 7A is a portion of cross sectional view of a device assembling system to another embodiment of the invention.
Figure 7B:
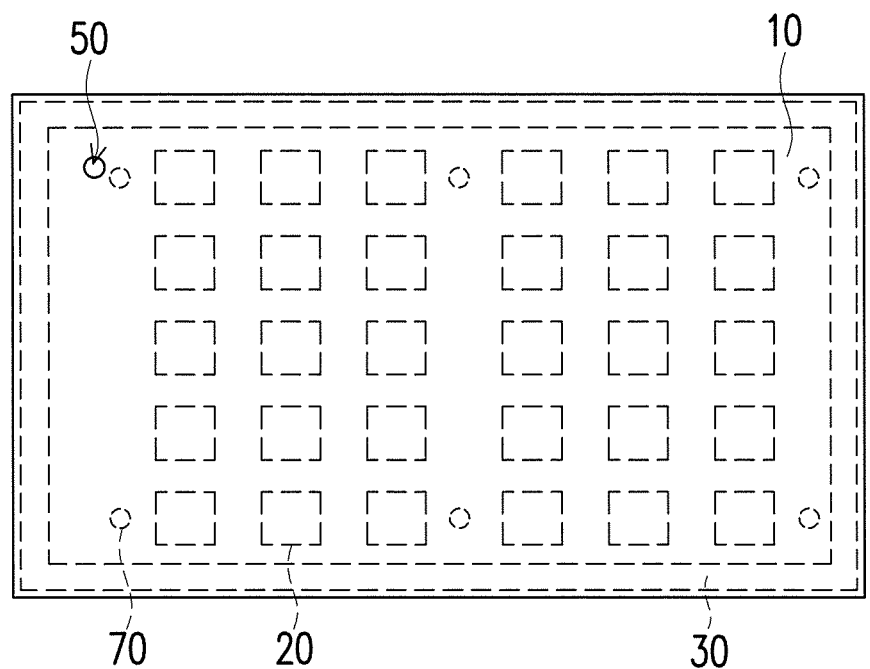
FIG. 7B is a top view of a device assembling system to another embodiment of the invention.

FIG. 7A is a portion of cross sectional view of a device assembling system to another embodiment of the invention. FIG. 7B is a top view of a device assembling system to another embodiment of the invention. Referring to FIGS. 7A and 7B, the device assembling system includes a substrate 10, a plurality of actuated devices 20, an airtight structure 30, a dividing plate 40, and a plurality of blocking structure

70. The actuated devices 20 are disposed on the substrate 10 and located between the substrate 10 and the dividing plate 40. The dividing plate 40 includes a plurality of through holes 401, and the dividing plate 40 is connected to the substrate 10 through the airtight structure 30. The through holes 401 are respectively located on the dividing plate corresponding to the actuated devices 20. The substrate 10, the airtight structure 30, and the dividing plate 40 form a chamber. The substrate 10 includes a channel connected to an external vacuum pump. The blocking structure 70 are disposed intervally in the chamber and respectively connected to the substrate 10 and the dividing plate 40, to enhance the structure strength of the chamber. As a result, when the external vacuum pump is active, a distance between the substrate 10 and the dividing plate 40 is secured by the blocking structures 70. The blocking structures 70, for example, are disposed in a manner of array in the chamber, but the disclosure is not limited thereto.

Figure 8A:
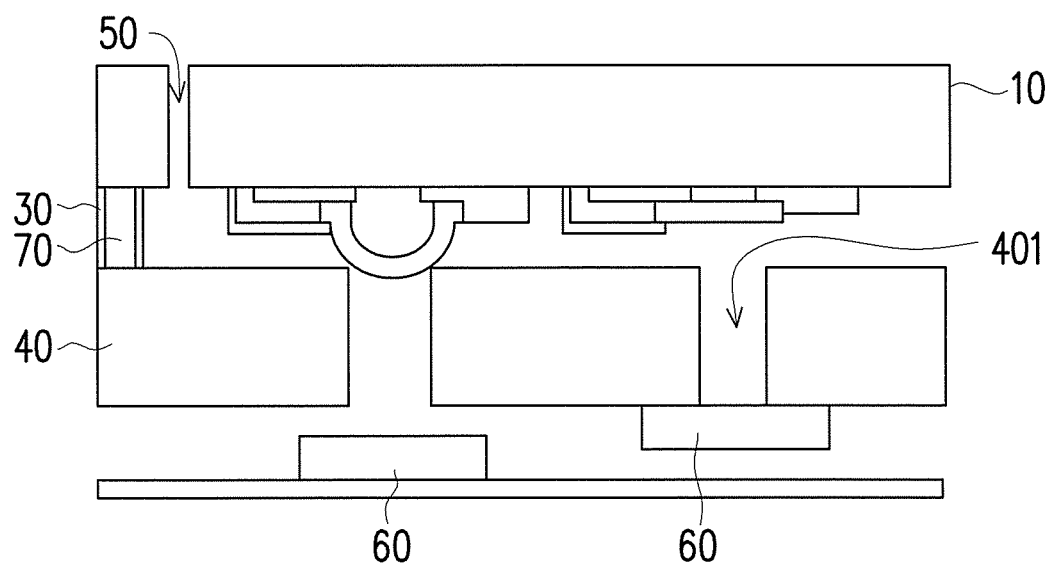
FIG. 8A is a portion of cross sectional view of a device assembling system to the other embodiment of the invention.
Figure 8B:
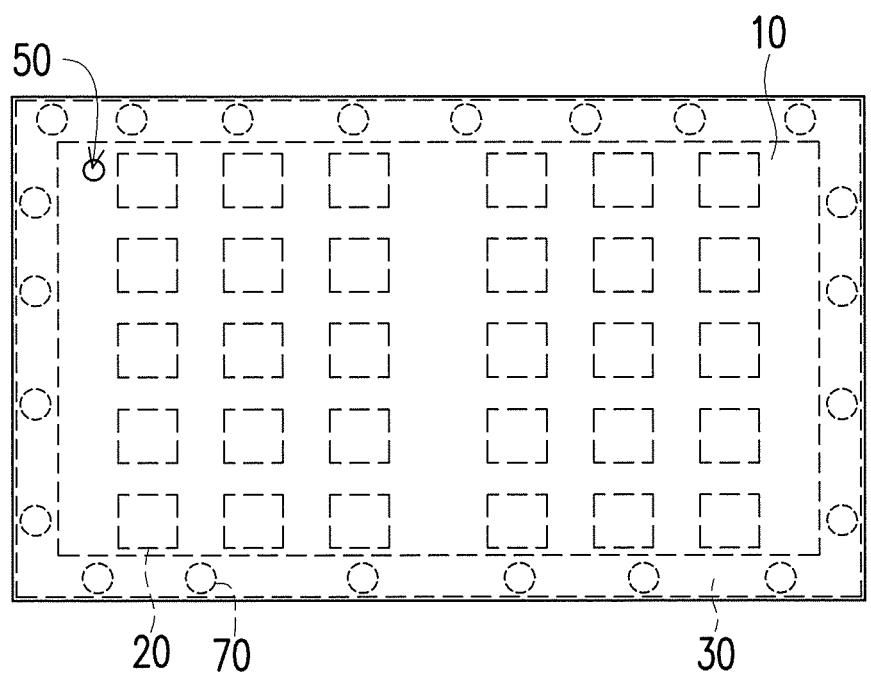
FIG. 8B is a top view of a device assembling system to the other embodiment of the invention.

FIG. 8A is a portion of cross sectional view of a device assembling system to the other embodiment of the invention. FIG. 8B is a top view of a device assembling system to the other embodiment of the invention. Referring to FIGS. 8A and 8B, the device assembling system includes a substrate 10, a plurality of actuated devices 20, an airtight structure 30, a dividing plate 40, and a plurality of blocking structure 70. The actuated devices 20 are disposed on the substrate 10 and located between the substrate 10 and the dividing plate 40. The dividing plate 40 includes a plurality of through holes 401, and the dividing plate 40 are connected to the substrate 10 through the airtight structure 30. The through holes 401 are respectively located on the dividing plate corresponding to the actuated devices 20. The substrate 10, the airtight structure 30, and the dividing plate 40 form a chamber, and the substrate 10 includes a channel 50 connected to an external vacuum pump. The blocking structures 70 are disposed in the airtight structure 30 and respectively connected to the substrate 10 and the dividing plate 40, as to enhance the structure strength of the chamber. As a result, when the external vacuum pump is active, a distance between the substrate 10 and the dividing plate 40 is secured by the blocking structures 70.

Figure 9:
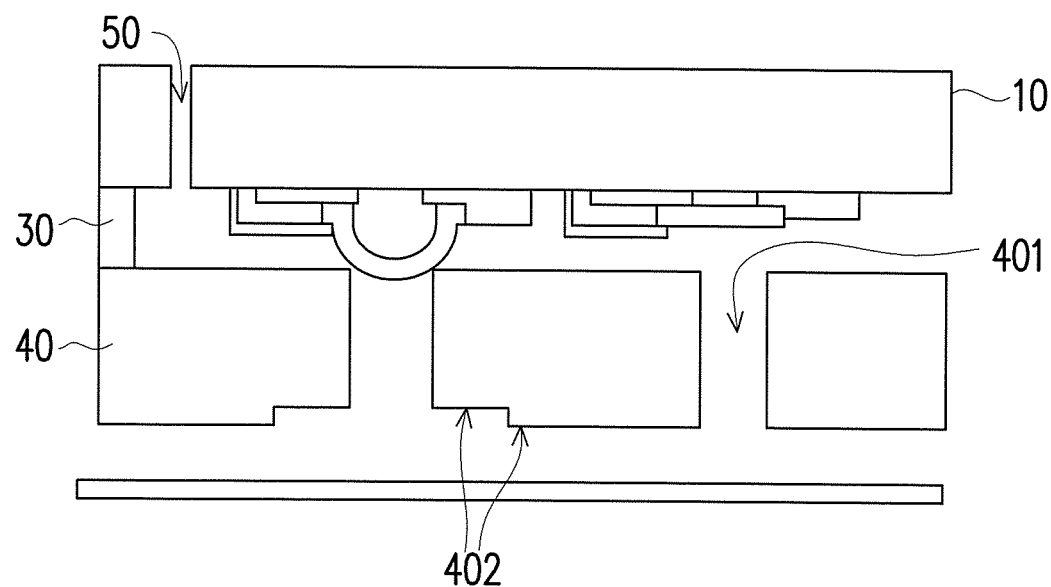
FIG. 9 is a portion of cross sectional view of a device assembling system to still the other embodiment of the invention.

FIG. 9 is a portion of cross sectional view of a device assembling system to still the other embodiment of the invention. The device assembling system includes a substrate 10, a plurality of actuated devices 20, an airtight structure 30, and a dividing plate 40. The actuated devices 20 are disposed on the substrate 10 and located between the substrate 10 and the dividing plate 40. The dividing plate 40 includes a plurality of through holes 401, and the dividing plate 40 are connected to the substrate through the airtight structure 30. The through holes 401 are respectively located on the dividing plate 40 corresponding to the actuated devices 20. The substrate 10, the airtight structure 30, and the dividing plate 40 form a chamber. The substrate 10 includes a channel connected to an external vacuum pump. In the embodiment, the surface of the dividing plate 40 outside of the chamber comprising a plurality regions 402, and each of the regions has different height related to the substrate 10, as to enhance the selective ability of the device assembling system of the disclosure to devices with different thickness.

Figure 10:
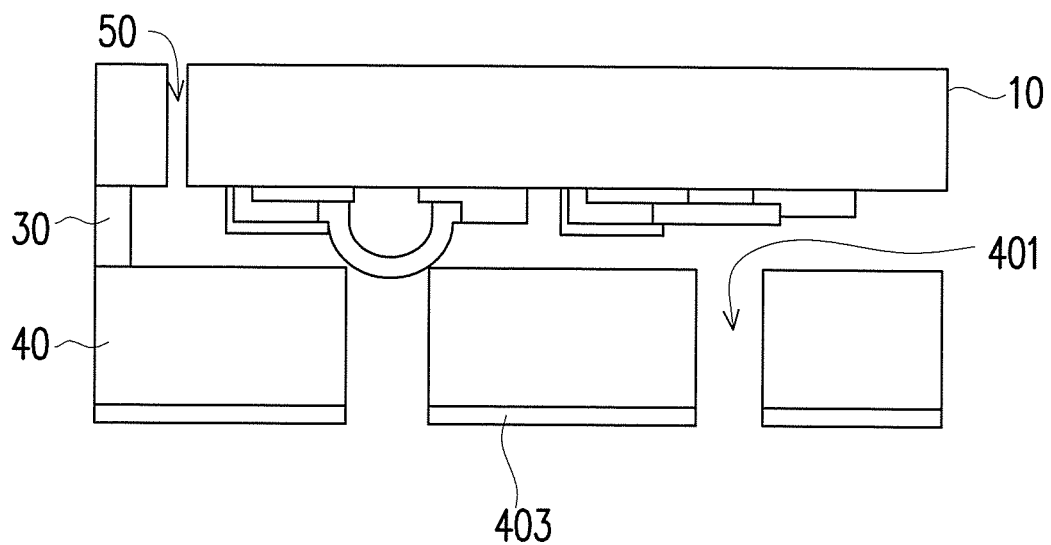
FIG. 10 is a portion of cross sectional view of a device assembling system to still the other embodiment of the invention.

FIG. 10 is a portion of cross sectional view of a device assembling system to still the other embodiment of the invention. The device assembling system includes a substrate 10, a plurality of actuated devices 20, an airtight structure 30, and a dividing plate 40. The actuated devices 20 are disposed on the substrate 10 and located between the substrate 10 and the dividing plate 40. The dividing plate 40 includes a plurality of through holes 401, and the dividing plate 40 is connected to the substrate 10 through the airtight structure 30. The through holes 401 are respectively located on the dividing plate 40 corresponding to the actuated devices 20. The substrate 10, the airtight structure 30, and the dividing plate 40 form a chamber. The substrate 10 includes a channel 50 connected to an external vacuum pump. In the embodiment, the dividing plate 40 includes an elastic material layer 403. The elastic material layer 403 is disposed on a surface of the dividing plate 40 outside of the chamber, as to enhance the selective ability of devices with different thickness or composed of different materials.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A device assembling system, comprising:
a plurality of actuated devices is disposed on a surface of a substrate in a manner of array, wherein each of the actuated devices comprising:
a first electrode disposed on and in contact with the surface of the substrate and electrically connected to the substrate;
a connecting pad disposed on and in contact with the surface of the substrate;
an electroactive material layer comprising a first surface and a second surface, wherein an end of the first surface is directly connected to the first electrode, and another end of the first surface is directly connected to the connecting pad; and
a second electrode disposed on the second surface of the electroactive material layer, and electrically connected to the substrate.

2. The device assembling system as claimed in claim 1, wherein the first electrodes are connected in parallel and disposed on the substrate, and the second electrodes are connected in parallel and disposed on the substrate.

3. The device assembling system as claimed in claim 1, wherein the first electrodes provide a first voltage and the second electrodes provide a second voltage to active the actuated devices, to deform the electroactive material layers.

4. The device assembling system as claimed in claim 3, further comprising a plurality of switching devices respectively connected to each of the first electrodes or the second electrodes of the actuated device to selectively active at least one of the actuated devices.

5. The device assembling system as claimed in claim 1, wherein the connecting pad is a third electrode, and an electric potential of the third electrode is same of an electric potential of the first electrode.

6. The device assembling system as claimed in claim 1, further comprising a dielectric layer disposed between the first electrode and the second electrode for insulating the first electrode and the second electrode.

7. The device assembling system as claimed in claim 1, wherein each of the actuated devices further comprising a base material layer, the base material layer and the electroactive material layer are stacked to form a stacked material layer, the stacked material layer bends to a side of the electroactive material layer as the electroactive material layer expands, and the stacked material layer bends to a side of the base material layer as the electroactive material layer contracts.

\* \* \* \* \*